US008162671B2

(12) United States Patent
Matsubara et al.

(10) Patent No.: US 8,162,671 B2
(45) Date of Patent: Apr. 24, 2012

(54) RECEPTACLE STRUCTURE, PRINTED WIRING BOARD STRUCTURE, AND ELECTRONIC DEVICE

(75) Inventors: Ryou Matsubara, Osaka (JP); Shouichi Mimura, Osaka (JP); Hirotsugu Fusayasu, Kyoto (JP); Masafumi Kumoi, Osaka (JP); Toshiyuki Nakaie, Osaka (JP)

(73) Assignee: Panasonic Corporation, Osaka (JP)

( * ) Notice: Subject to any disclaimer, the term of this patent is extended or adjusted under 35 U.S.C. 154(b) by 20 days.

(21) Appl. No.: 12/837,517

(22) Filed: Jul. 16, 2010

(65) Prior Publication Data

US 2011/0201214 A1    Aug. 18, 2011

(30) Foreign Application Priority Data

Feb. 18, 2010   (JP) ................... 2010-033996

(51) Int. Cl.
*H01R 12/00*   (2006.01)
(52) U.S. Cl. ........................................... 439/60
(58) Field of Classification Search ............ 439/60, 439/65, 677, 55
See application file for complete search history.

(56) References Cited

U.S. PATENT DOCUMENTS

| | | | |
|---|---|---|---|
| 5,496,180 A * | 3/1996 | Fabian et al. ................... | 439/60 |
| 6,186,836 B1 | 2/2001 | Ezawa et al. | |
| 6,264,500 B1 * | 7/2001 | Kawabe ................... | 439/607.37 |
| 6,508,678 B1 * | 1/2003 | Yang ............................. | 439/677 |
| 6,561,850 B2 * | 5/2003 | Letourneau et al. ..... | 439/607.08 |
| 6,612,876 B2 * | 9/2003 | Hyland ......................... | 439/676 |
| 7,442,051 B2 * | 10/2008 | Jiang et al. ................... | 439/76.1 |
| 2001/0024889 A1 | 9/2001 | Koyama et al. | |
| 2007/0000974 A1 | 1/2007 | Kubo | |
| 2007/0035036 A1 | 2/2007 | Sota et al. | |

FOREIGN PATENT DOCUMENTS

| | | |
|---|---|---|
| JP | H05-031172 U | 4/1993 |
| JP | 2741865 B | 1/1998 |
| JP | H10-270125 A | 10/1998 |
| JP | 2000-021474 A | 1/2000 |
| JP | 2001-266979 A | 9/2001 |
| JP | 3333457 B | 7/2002 |
| JP | 2007-012899 A | 1/2007 |
| JP | 2007-53121 A | 3/2007 |
| JP | 2007-115707 A | 5/2007 |
| JP | 2009-009728 A | 1/2009 |

OTHER PUBLICATIONS

Notice of Allowance issued in co-pending U.S. Appl. No. 12/904,164.

* cited by examiner

*Primary Examiner* — Briggitte R Hammond
(74) *Attorney, Agent, or Firm* — Shinjyu Global IP (57) ABSTRACT

A receptacle structure includes a housing structure, a terminal insulating board, a first terminal and a second terminal. The housing structure is configured to be mounted on a printed wiring board and to accommodate a plug. The terminal insulating board includes a top face and a bottom face that is opposite to the top face. The terminal insulating board is disposed inside the housing structure with the bottom face facing towards the printed wiring board. The first terminal is connected to the printed wiring board via the first rear connection part and to the terminal insulating board. The second terminal is connected to the printed wiring board via the first front connection part and to the terminal insulating board. The first front connection part has a width narrower than the first rear connection part and is connected to the printed wiring board away from the first rear connection part.

14 Claims, 8 Drawing Sheets

RECEPTACLE STRUCTURE, PRINTED WIRING BOARD STRUCTURE, AND ELECTRONIC DEVICE

CROSS-REFERENCE TO RELATED APPLICATIONS

This application claims priority under 35 U.S.C. §119 to Japanese Patent Application No. 2010-033996 filed on Feb. 18, 2010. The entire disclosure of Japanese Patent Application No. 2010-033996 is hereby incorporated herein by reference.

BACKGROUND

1. Technical Field

The present invention relates to a receptacle structure, a printed wiring board structure and an electronic device equipped with the receptacle structure and the printed wiring board structure.

2. Background Information

Recent years have witnessed the widespread application of technology whereby digital signals are sent at high speed between electronic devices (such as AV devices or portable devices) via an interface that conforms to the HDMI (High-Definition Multimedia Interface®) standard, the USB (Universal Serial Bus) standard, or the like. These interfaces are made up of a receptacle that is mounted on a mounting face of a printed wiring board, and a plug that is inserted into the receptacle.

The receptacle includes a terminal insulating board, a plurality of bottom terminals, and a plurality of top terminals. The terminal insulating board has a bottom face opposed to the printed wiring board, and a top face provided on the opposite side of the bottom face. The bottom terminals are connected to the printed wiring board and to the bottom face of the terminal insulating board. The top terminals are connected to the printed wiring board and to the top face of the terminal insulating board.

The printed wiring board includes a plurality of front lands, a plurality of rear lands, and a plurality of wires which are formed on the mounting face. The top terminals are connected to the front lands. The rear lands are connected to the bottom terminals. The wires extend from the front and rear lands toward the center side of the mounting face.

The bottom terminals are usually connected to the printed wiring board on the terminal insulating board side of the top terminals in order to simplify the terminal structure (see Japanese Laid-Open Patent Application 2009-9728, for example). Specifically, the rear lands are provided on the terminal insulating board side of the front lands.

SUMMARY

To reduce the wiring area located on the mounting face of the printed wiring board, the wires extending from one of the rear lands must pass between two of the front lands, thereby creating a very fine wiring pattern. However, it has been discovered that shoddy or inexpensive substrates can not accommodate this very fine wiring pattern. Instead, higher quality or more expensive substrates must be used, which, as a result, drives up the cost of manufacturing the printed wiring board.

In view of the state of the known technology, one aspect of the disclosure herein is a receptacle structure includes a housing structure, a terminal insulating board, a first terminal and a second terminal. The housing structure is configured to be mounted on a printed wiring board and to accommodate a plug. The terminal insulating board includes a top face and a bottom face that is opposite to the top face. The terminal insulating board is disposed inside the housing structure with the bottom face facing towards the printed wiring board. The first terminal is connected to the printed wiring board via the first rear connection part and to the terminal insulating board. The second terminal is connected to the printed wiring board via the first front connection part and to the terminal insulating board. The first front connection part has a width narrower than the first rear connection part and is connected to the printed wiring board away from the first rear connection part.

BRIEF DESCRIPTION OF THE DRAWINGS

Referring now to the attached drawings which form a part of this original disclosure.

DETAILED DESCRIPTION OF EMBODIMENTS

Embodiments of the present invention will now be explained with reference to the drawings. It will be apparent to those skilled in the art from this disclosure that the following descriptions of the embodiments are provided for illustration only and not for the purpose of limiting the present invention as defined by the appended claims and their equivalents. In the description of the drawings that follows, those components that are the same or similar are numbered the same or similarly. However, the drawings are just schematic, and the dimensional proportions and so forth may not always be the same as with an actual product. Therefore, all specific dimensions and so forth should be judged with the following description in mind. Naturally, the following encompasses portions for which the dimensional relations and proportions differ between the drawings.

1: Configuration of Interface

The configuration of an interface pertaining to this embodiment will be described through reference to the drawings. In this embodiment, the interface 10 that conforms to the HDMI (High-Definition Multimedia Interface®) standard will be described as an example of an interface between electronic devices. Examples of electronic devices here include AV devices, portable devices, personal computers, and the like.

Figure 1:
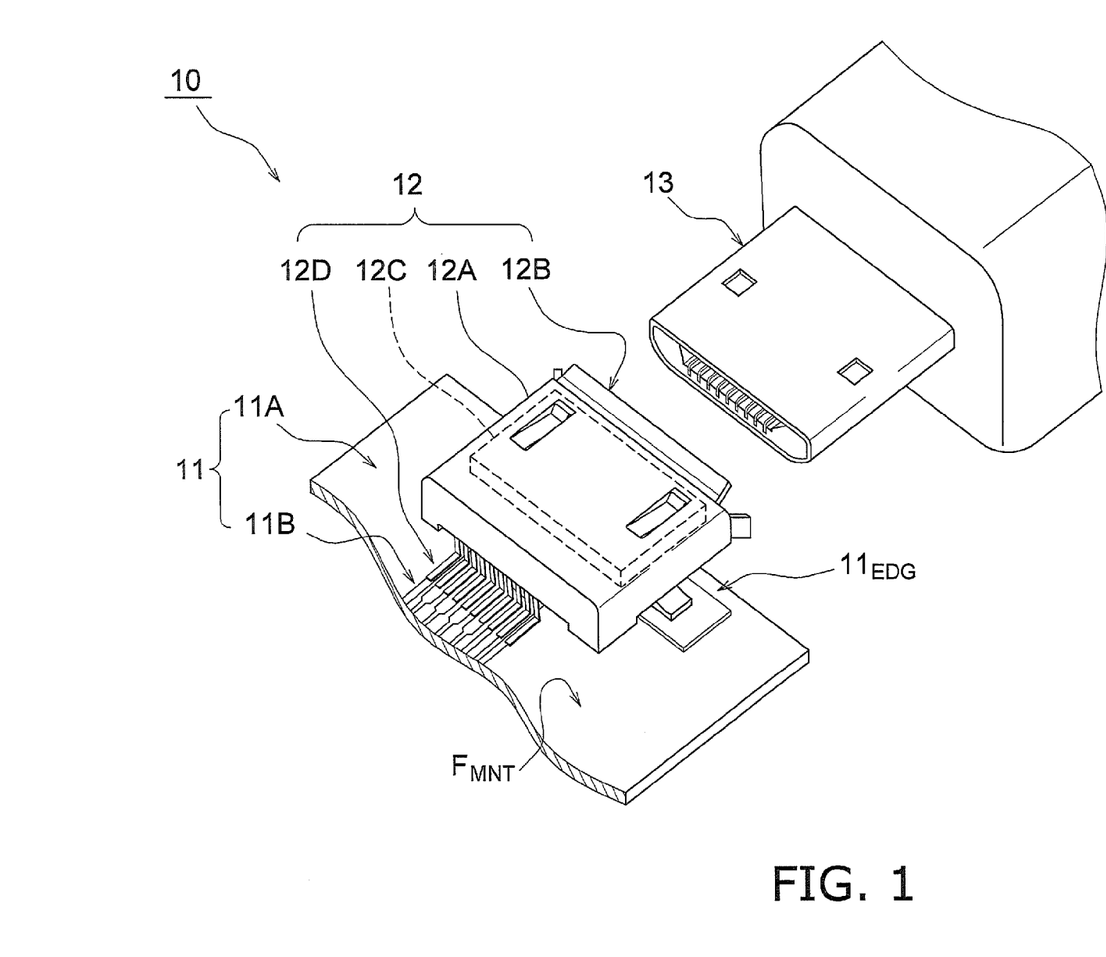
FIG. 1 is an oblique view of the configuration of an interface 10 pertaining to an embodiment.

FIG. 1 is an oblique view of the configuration of the interface 10 pertaining to this embodiment. As shown in FIG. 1, the interface 10 is made up of a printed wiring board 11, a receptacle 12, and a plug 13.

The printed wiring board 11 is built into a first electronic device (not shown). The printed wiring board 11 includes a substrate body 11A and a wiring group 11B. The substrate body 11A has a mounting face $F_{MNT}$. The configuration of the printed wiring board 11 will be discussed below.

The receptacle 12 is mounted on the mounting face $F_{MNT}$ at the edge portion $11_{EDG}$ of the printed wiring board 11. The receptacle 12 includes a housing 12A, an opening 12B, a terminal insulating board 12C, and a terminal group 12D. The configuration of the receptacle 12 will be discussed below.

The plug 13 is built into a second electronic device (not shown). The plug 13 is electrically connected to the receptacle 12 when the plug 13 is inserted into the opening 12B. The plug 13 sends digital signals between the first and second electronic devices.

2: Configuration of Receptacle

Figure 2:
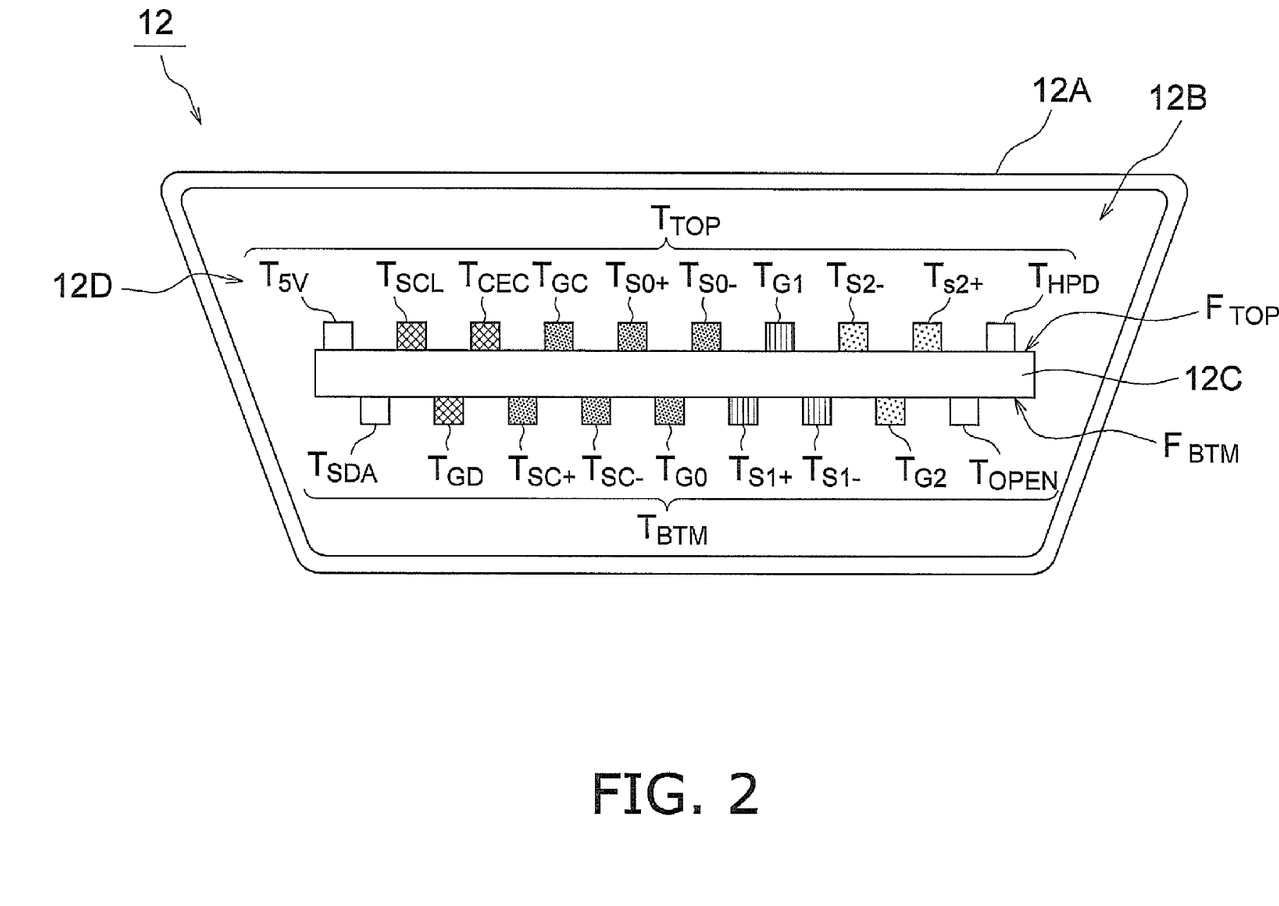
FIG. 2 is a plan view of a receptacle 12 pertaining to an embodiment, as viewed from an opening 12B side.
Figure 3:
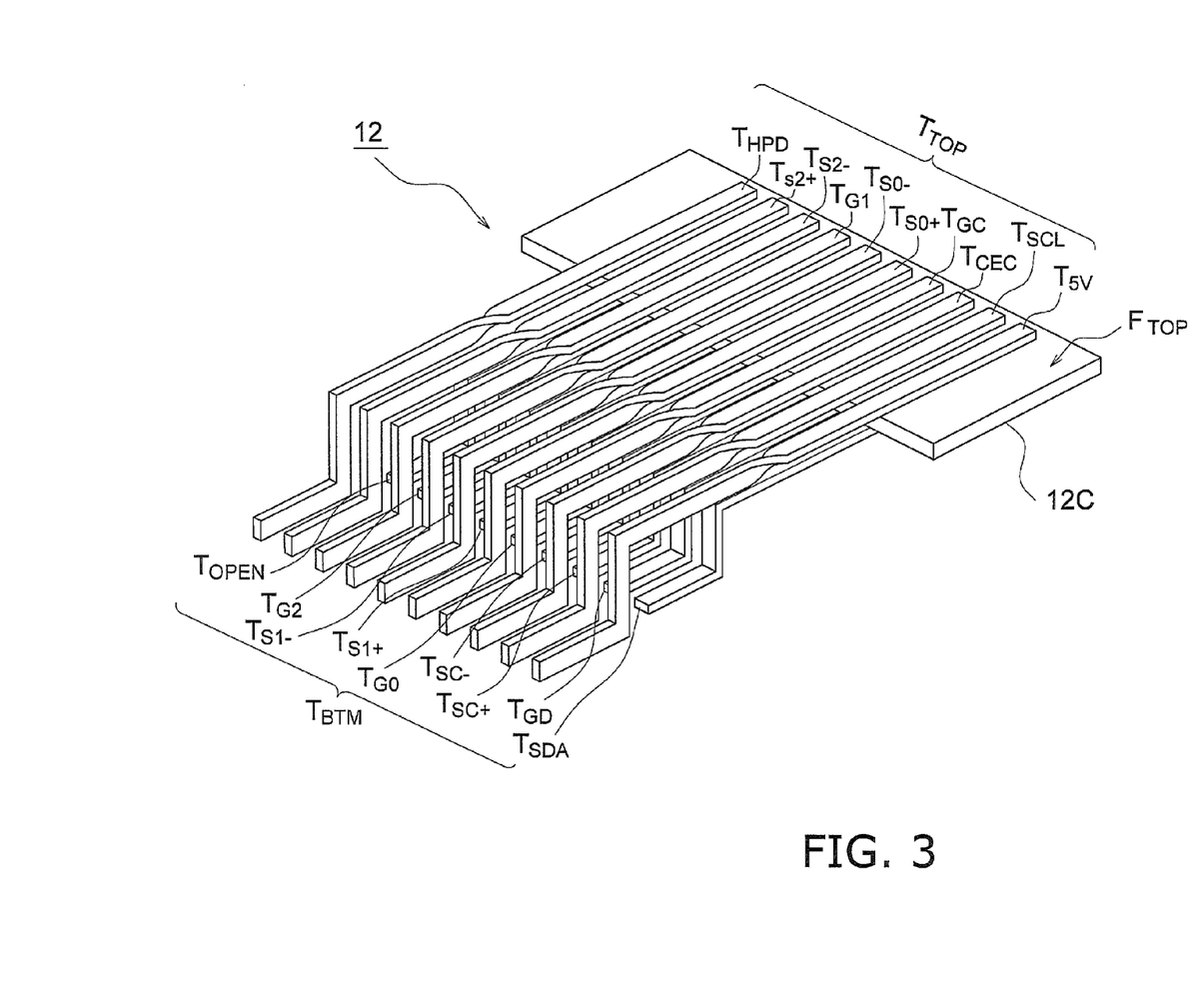
FIG. 3 is an oblique view of the internal configuration of the receptacle 12 pertaining to an embodiment.

The configuration of the receptacle pertaining to this embodiment will now be described through reference to the drawings. FIG. 2 is a plan view of a receptacle 12 pertaining to this embodiment, as viewed from an opening 12B side. FIG. 3 is an oblique view of the internal configuration of the receptacle 12 pertaining to this embodiment. The housing 12A is not depicted in FIG. 3.

As shown in FIGS. 2 and 3, the receptacle 12 includes the housing 12A, the opening 12B, the terminal insulating board 12C, and the terminal group 12D.

The housing 12A is a container that holds the terminal insulating board 12C and the terminal group 12D.

The opening 12B is formed in the housing 12A. The plug 13 is inserted into the opening 12B. Although not shown in the drawings, the opening 12B is exposed from the package of the first electronic device.

The terminal insulating board 12C is a flat board provided inside the housing 12A. The terminal insulating board 12C is fitted together with the plug 13. As shown in FIGS. 2 and 3, the terminal insulating board 12C has a top face $F_{TOP}$ and a bottom face $F_{BTM}$. The bottom face $F_{BTM}$ is opposed to the mounting face $F_{MNT}$. The top face $F_{TOP}$ is provided on the opposite side of the bottom face $F_{BTM}$.

The terminal group 12D is connected to the printed wiring board 11 (more precisely, the wiring group 11B) and the terminal insulating board 12C. The terminal group 12D sends digital signals between the printed wiring board 11 and the plug 13. The terminal group 12D has a plurality of bottom terminals $T_{BTM}$ and a plurality of top terminals $T_{TOP}$. The bottom terminals $T_{BTM}$ and the top terminals $T_{TOP}$ are disposed at mutually staggered positions as shown in FIG. 2.

The bottom terminals $T_{BTM}$ include an open terminal $T_{OPEN}$, a ground terminal $T_{G2}$, a pair of signal terminals $T_{S1+}$ and $T_{S1-}$, a ground terminal $T_{G0}$, a pair of signal terminals $T_{SC+}$ and $T_{SC-}$, a ground terminal $T_{GD}$, and an SDA terminal $T_{SDA}$. The bottom terminals $T_{BTM}$ are connected to the printed wiring board 11 and the bottom face $F_{BTM}$ of the terminal insulating board 12C. Each of the bottom terminals $T_{BTM}$ is made up of metal members in the form of bent plates. The configuration of the bottom terminals $T_{BTM}$ will be discussed in detail below.

The top terminals $T_{TOP}$ include an HPD signal terminal $T_{HPD}$, a pair of signal terminals $T_{S2+}$ and $T_{S2-}$, a ground terminal $T_{G1}$, a pair of signal terminals $T_{S0+}$ and $T_{S0-}$, a ground terminal $T_{GC}$, a CEC terminal $T_{CEC}$, an SCL terminal $T_{SCL}$, and a power supply terminal $T_{5V}$. The top terminals $T_{TOP}$ are connected to the printed wiring board 11 and the top face $F_{TOP}$ of the terminal insulating board 12C. Each of the top terminals $T_{TOP}$ is made up of metal members in the form of bent and twisted plates. Consequently, in a plan view of the mounting face $F_{MNT}$, the distal end of each of the top terminals $T_{TOP}$ on the printed wiring board 11 side is formed narrower than the distal end each of the bottom terminals $T_{BTM}$ on the printed wiring board 11 side. The configuration of the top terminals $T_{TOP}$ will be discussed in detail below.

The signal terminals $T_S$ send digital signals by a pseudo-differential signaling method such as TMDS (Transition Minimized Differential Signaling®) method. Therefore, the phase of the digital signals transmitted by the signal terminal $T_{S1+}$ is opposite to the phase of the signals transmitted by the signal terminals $T_{S1-}$.

The ground terminals $T_G$ ensure grounding of the corresponding signal terminals $T_S$. For example, the ground terminal $T_{G1}$ ensures grounding of the pair of signal terminals $T_{S1+}$ and $T_{S1-}$.

3: Configuration of Printed Wiring Board

Figure 4:
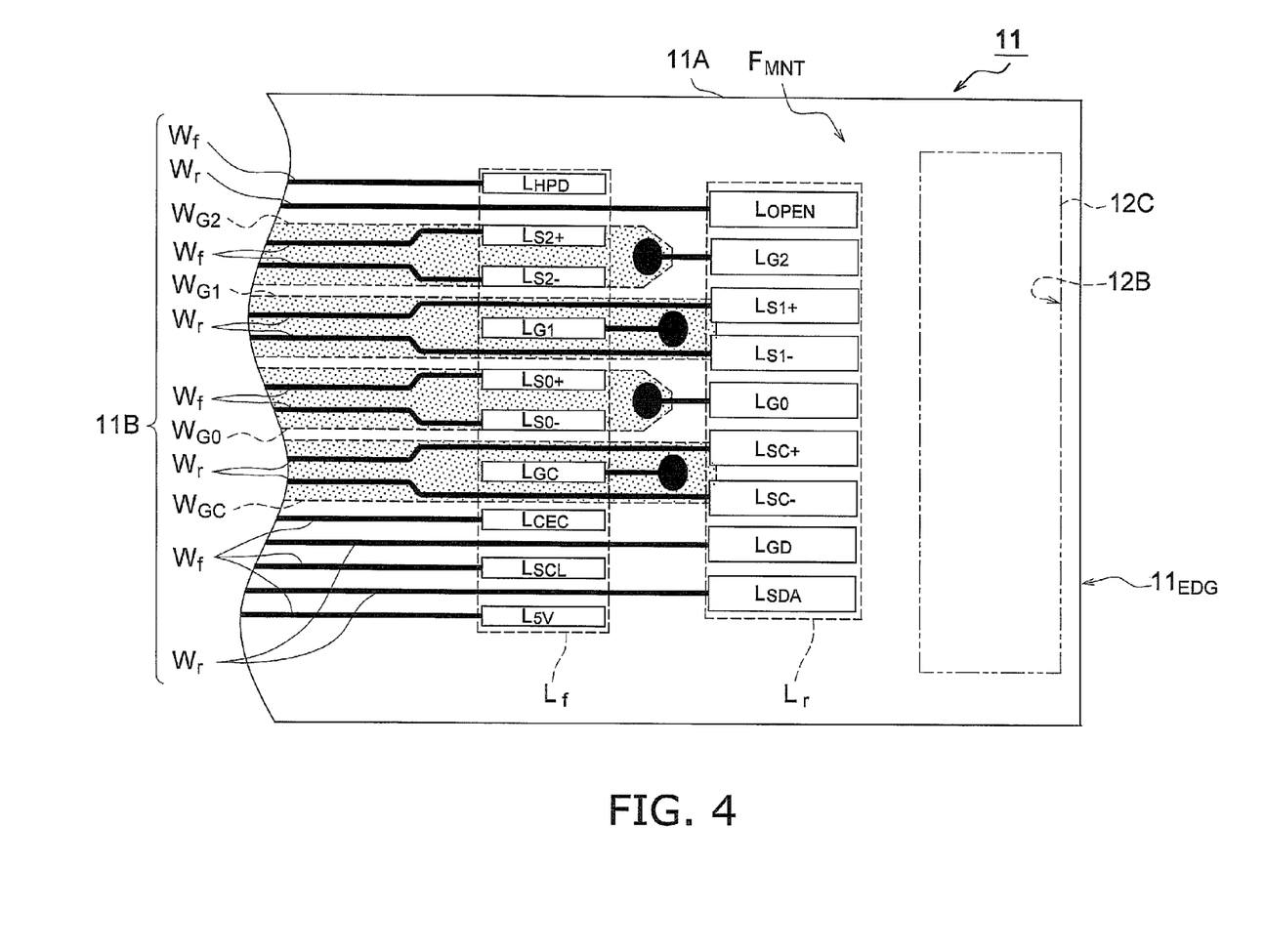
FIG. 4 is a plan view of a printed wiring board 11 pertaining to an embodiment, as viewed from a mounting face $F_{MNT}$ side.

The configuration of the printed wiring board pertaining to this embodiment will be described through reference to the drawings. FIG. 4 is a plan view of the printed wiring board 11 pertaining to this embodiment, as viewed from the mounting face $F_{MNT}$ side. In FIG. 4, the opening 12B and terminal insulating board 12C of the receptacle 12 are indicated by broken lines.

The printed wiring board 11 includes the substrate body 11A and the wiring group 11B.

The substrate body 11A is a multilayer substrate having the mounting face $F_{MNT}$. The receptacle 12 and various elements (not shown) are mounted on the mounting face $F_{MNT}$.

The wiring group 11B electrically connects the receptacle 12 and various elements. The wiring group 11B transmits digital signals between the receptacle 12 and various elements. The wiring group 11B has a plurality of rear lands Lr, a plurality of front lands Lf, a plurality of rear wires Wr, a plurality of front wires Wf, and a plurality of ground wires $W_G$.

The rear lands Lr are metal members for connecting the bottom terminals $T_{BTM}$. As shown in FIG. 4, the rear lands Lr include four signals terminal lands $L_S$. The four signal terminal lands $L_S$ are a pair of signal terminal lands $L_{S1+}$ and $L_{S1-}$ corresponding to the pair of signal terminals $T_{S1+}$ and $T_{S1-}$, and a pair of signal terminal lands $L_{SC+}$ and $L_{SC-}$ corresponding to the pair of signal terminals $T_{SC+}$ and $T_{SC-}$.

The front lands Lf are metal members for connecting the top terminals $T_{TOP}$. As shown in FIG. 4, the front lands Lf include two ground terminal lands $L_G$. The two ground terminal lands $L_G$ are a ground terminal land $L_{G1}$ corresponding to ground terminal $T_{G1}$, and a ground terminal land $L_{GC}$ corresponding to the ground terminal $T_{GC}$.

The ground terminal land $L_{G1}$ is farther away from the edge portion $11_{EDG}$ than the pair of signal terminal lands $L_{S1+}$ and $L_{S1-}$. Similarly, the ground terminal land $L_{GC}$ is farther away from the edge portion $11_{EDG}$ than the pair of signal terminal lands $L_{SC+}$ and $L_{SC-}$. Specifically, the ground terminal land $L_{G1}$ lies closer to the center side of the mounting face $F_{MNT}$ than the pair of signal terminal lands $L_{S1+}$ and $L_{S1-}$, in a plan view of the mounting face $F_{MNT}$. The ground terminal land $L_{GC}$ lies closer to the center side of the mounting face $F_{MNT}$ than the pair of signal terminal lands $L_{SC+}$ and $L_{SC-}$, in a plan view of the mounting face $F_{MNT}$.

In this embodiment, each of the front lands Lf is formed narrower than each of the rear lands Lr. The configuration of the front lands Lf and the rear lands Lr will be discussed in detail below.

The rear wires Wr are connected to the rear lands Lr. Although not depicted, the rear wires Wr are connected to the various elements that are mounted. Each of the rear wires Wr is lined between the two front lands Lf.

The front wires Wf are connected to the front lands Lf. Although not depicted, the front wires Wf are connected to the various elements that are mounted.

The ground wires $W_G$ are connected to the ground terminal lands $L_G$ through via interconnects. More specifically, the ground wires $W_G$ include a ground wire $W_{G2}$ connected to the ground terminal land $L_{G2}$, a ground wire $W_{G1}$ connected to the ground terminal land $L_{G1}$, the ground wire $W_{G0}$ connected to the ground terminal land $L_{G0}$, and a ground wire $W_{G2C}$ connected to the ground terminal land $L_{GC}$.

The ground wire $W_{G2}$ ensures grounding of the pair of front wires Wf extending form the pair of signal terminal lands $L_{S2+}$ and $L_{S2-}$. The ground wire $W_{G1}$ ensures grounding of the pair of rear wires Wr extending form the pair of signal terminal lands $L_{S1+}$ and $L_{S1-}$. The ground wire $W_{G0}$ ensures grounding of the pair of front wires Wf extending form the pair of signal terminal lands $L_{S0+}$ and $L_{S0-}$. The ground wire $W_{GC}$ ensures grounding of the pair of rear wires Wr extending form the pair of signal terminal lands $L_{SC+}$ and $L_{SC-}$.

4: Overall Configuration of Terminals and Lands

Figure 5:
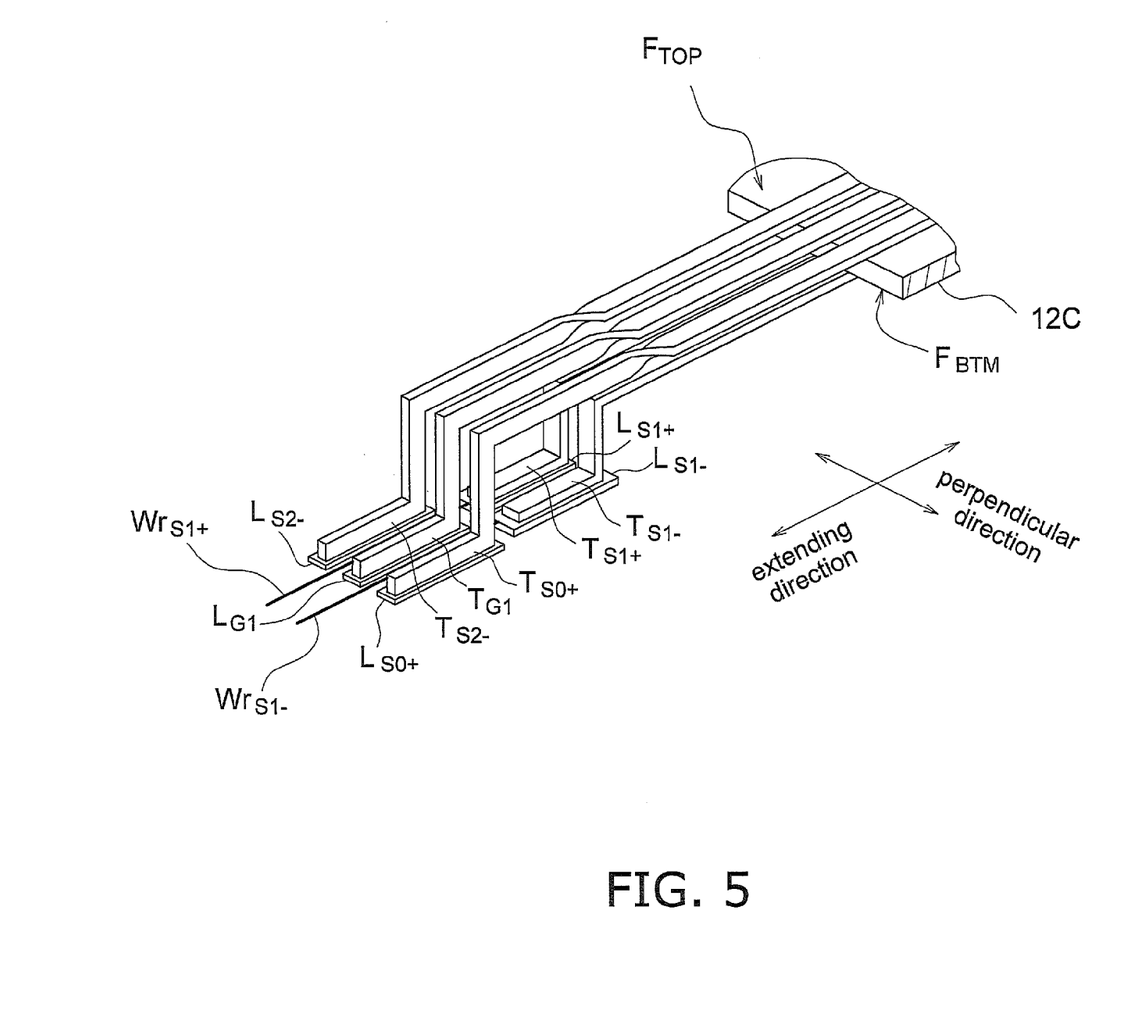
FIG. 5 is a detail oblique view of FIG. 3.

Next, the overall configuration of terminals and lands will be described through reference to the drawings. FIG. 5 is a detail oblique view of FIG. 3.

As shown in FIG. 5, the signal terminal $T_{S1+}$ (first terminal) is connected to the bottom face $F_{BTM}$ of the terminal insulating board 12C and to the ground terminal land $L_{S1+}$ of the printed wiring board 11. The ground terminal $T_{G1}$ (second terminal) is connected to the top face $F_{TOP}$ of the terminal insulating board 12C and to the ground terminal land $L_{G1}$ of the printed wiring board 11. The signal terminal $T_{S2-}$ (third terminal) is connected to the top face $F_{TOP}$ p of the terminal insulating board 12C and to the ground terminal land $L_{S2-}$ of the printed wiring board 11. The signal terminal $T_{S1-}$ (fourth terminal) is connected to the bottom face $F_{BTM}$ of the terminal insulating board 12C and to the signal terminal land $L_{S1-}$ of the printed wiring board 11. The signal terminal $T_{S0+}$ (fifth terminal) is connected to the top face $F_{TOP}$ of the terminal insulating board 12C and to the signal terminal land $L_{S0+}$ of the printed wiring board 11.

The signal terminals $T_{S1+}$ and $T_{S1-}$ are adjacent to each other in a perpendicular direction which is perpendicular to an extending direction in which the terminals extend.

The ground terminal $T_{G1}$, the signal terminal $T_{S2-}$, and the signal terminal $T_{S0+}$ are adjacent to each other in the perpendicular direction.

The signal terminal land $L_{S1+}$ and the signal terminal land $L_{S1-}$ are adjacent to each other in the perpendicular direction on the mounting face $F_{MNT}$ (see FIG. 4). That is, the signal terminal land $L_{S1-}$ is provided on the side of the signal terminal land $L_{S1+}$.

The ground terminal land $L_{G1}$, the signal terminal land $L_{S2-}$, and the signal terminal land $L_{S0+}$ are adjacent to each other in the perpendicular direction on the mounting face $F_{MNT}$. That is, the signal terminal land $L_{S2-}$ is provided on the side of the ground terminal land $L_{G1}$. The signal terminal land $L_{S0+}$ is provided on the opposite side from the signal terminal $T_{S2-}$, with the ground terminal land $L_{G1}$ in between.

A rear wire $Wr_{S1+}$ included in the rear wires Wr is connected to the signal terminal land $L_{S1+}$. The rear wire $Wr_{S1+}$ is provided from the signal terminal land $L_{S1+}$ and lined between the ground terminal land $L_{G1}$ and the signal terminal land $L_{S2-}$ included in the front lands Lf.

Figure 6:
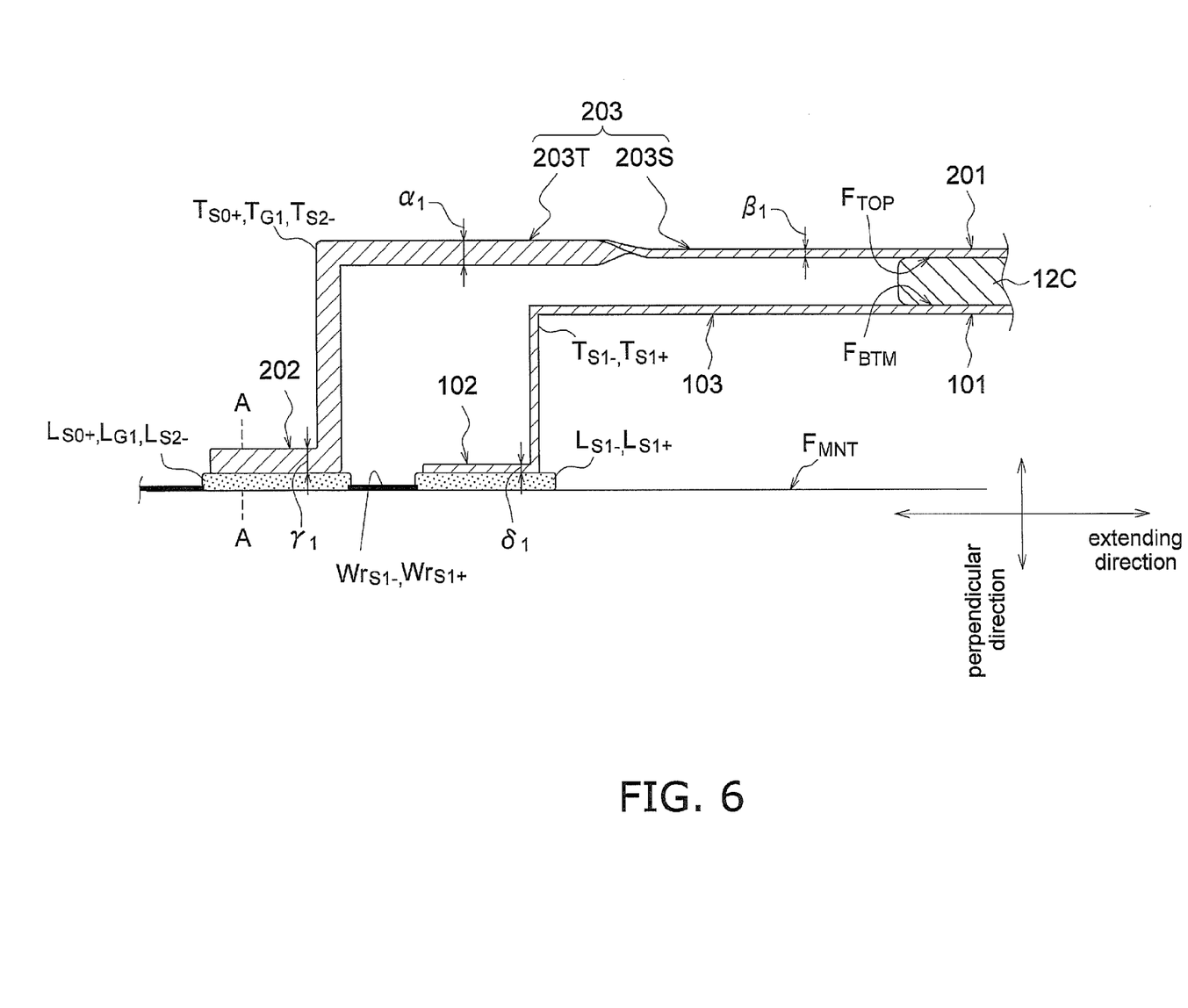
FIG. 6 is a side view of the terminals shown in FIG. 5.
Figure 7:
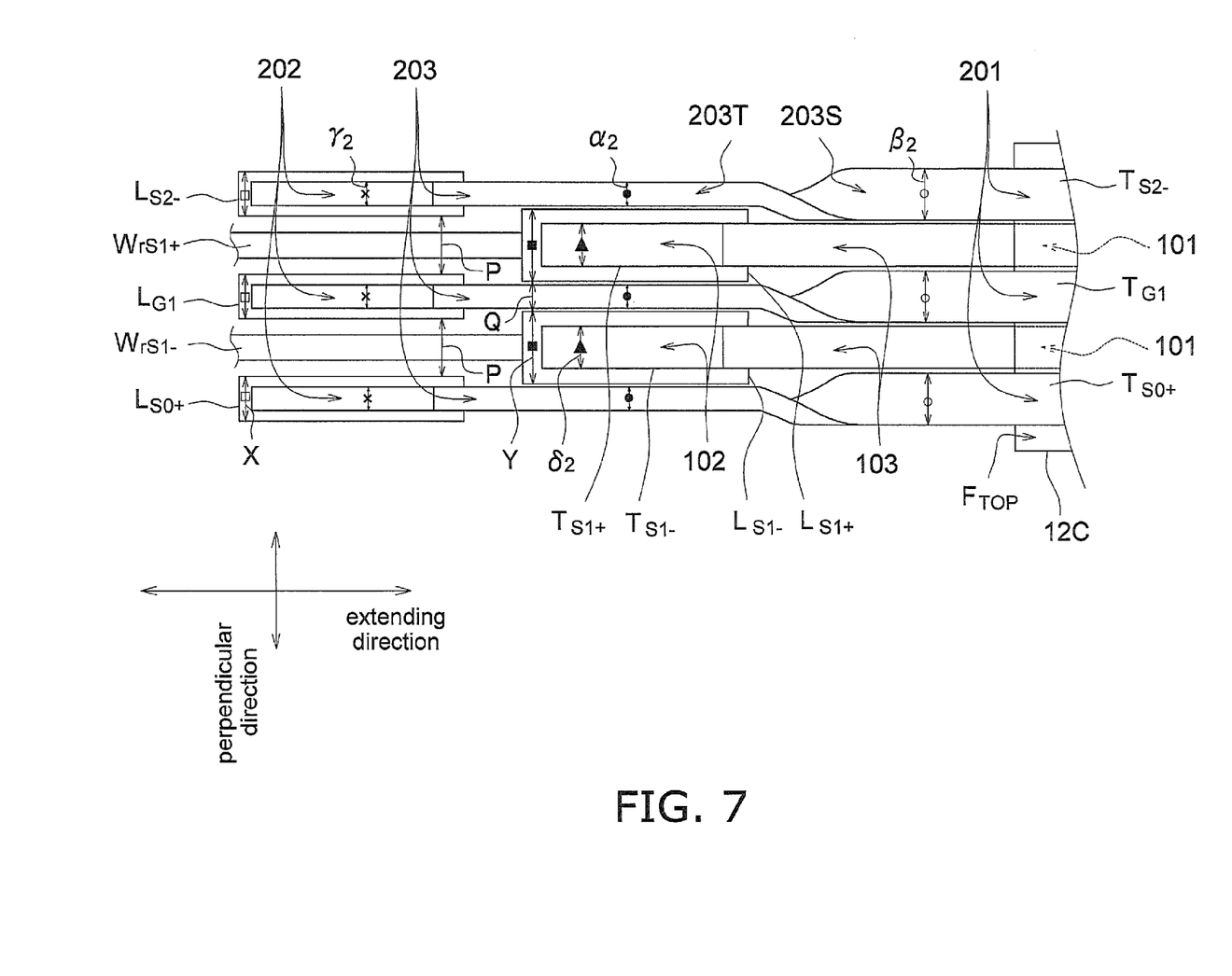
FIG. 7 is a plan view of the terminals, lands, and wires shown in FIG. 5, as viewed from an top face $F_{TOP}$ side.

A rear wire $Wr_{S1-}$ included in the rear wires Wr is connected to the signal terminal land $L_{S1-}$. The rear wire $Wr_{S1-}$ is provided from the signal terminal land $L_{S1-}$ and lined between the ground terminal land $L_{G1}$ and the signal terminal land $L_{S2+}$ included in the front lands Lf 5: Detailed Configuration of Terminals and Lands Next, the detailed configuration of terminals and lands will be described through reference to the drawings. FIG. 6 is a side view of the terminals shown in FIG. 5. FIG. 7 is a plan view of the terminals, lands, and wires shown in FIG. 5, as viewed from the top face $F_{TOP}$ side. In FIG. 6, the terminals are mutually overlapped.

The signal terminal $T_{S1+}$ has a bottom face connection part 101, a rear connection part 102, and a linking part 103.

As shown in FIG. 6, the bottom face connection part 101 is connected to the bottom face $F_{BTM}$ of the terminal insulating board 12C. The bottom face connection part 101 is exposed at the opening 12B (see FIG. 2). The bottom face connection part 101 comes into direct contact with the plug 13 inserted in the opening 12B. The rear connection part 102 is connected to the signal terminal land $L_{S1+}$ by solder or another such conductive joining material. The linking part 103 links the bottom face connection part 101 and the rear connection part 102.

The signal terminal $T_{S1-}$ has a bottom face connection part 101, a rear connection part 102, and a linking part 103. The configuration of the signal terminal $T_{S1-}$ is the same as that of the signal terminal $T_{S1+}$.

The ground terminal $T_{G1}$ has a top face connection part 201, a front connection part 202, and a linking part 203. The top face connection part 201 is connected to the top face $F_{TOP}$ of the terminal insulating board 12C. The top face connection part 201 is exposed at the opening 12B (see FIG. 2). The top face connection part 201 comes into direct contact with the plug 13 inserted in the opening 12B. The front connection part 202 is connected to the ground terminal land $L_{G1}$ by solder or another such conductive joining material. The linking part 203 links the top face connection part 201 and the front connection part 202.

The signal terminal $T_{S2-}$ has a top face connection part 201, a front connection part 202, and a linking part 203. The signal terminal $T_{S0+}$ has a top face connection part 201, a front connection part 202, and a linking part 203. The configuration of the signal terminal $T_{S2-}$ is the same as that of the signal terminal $T_{S2-}$, and the configuration of the signal terminal $T_{S0+}$ is the same as that of the signal terminal $T_{S2-}$.

The linking part 203 is formed by twisting process. More specifically, the linking part 203 is twisted approximately 90 degrees around an axis which is along the extending direction. This forms a wide portion 203S and a narrow portion 203T on the linking part 203. The wide portion 203S is linked to the top face connection part 201 and the narrow portion 203T. The narrow portion 203T is linked to the wide portion 203S and the front connection part 202.

As discussed above, the terminals are constituted by flat metal members, so the thickness $\alpha_1$ of the narrow portion 203T is greater than the thickness $\beta_1$ of the wide portion 203S. The thickness $\gamma_1$ of the front connection part 202 is substantially the same as the thickness $\alpha_1$ of the narrow portion 203T. The thickness $\delta_1$ of the rear connection part 102 is substantially the same as the thickness $\beta_1$ of the wide portion 203S. Therefore, the thickness $\gamma_1$ of the front connection part 202 is greater than the thickness $\delta_1$ of the rear connection part 102. In this embodiment, "thickness" is the height in the vertical direction with respect to the top face $F_{TOP}$.

As shown in FIG. 7, the width $\alpha_2$ of the narrow portion 203T is narrower than the width $\beta_2$ of the wide portion 203S. The width $\gamma_2$ of the front connection part 202 is substantially the same as the width $\alpha_2$ of the narrow portion 203T. The width $\delta_2$ of the rear connection part 102 is substantially the same as the width $\beta_2$ of the wide portion 203S. Therefore, the width $\gamma_2$ of the front connection part 202 is narrower than the width $\delta_2$ of the rear connection part 102.

The width X of the front lands Lf (including the ground terminal land $L_{G1}$, the signal terminal land $L_{S2-}$, and the signal terminal land $L_{S0+}$) is narrower than the width Y of the rear lands Lr (including the signal terminal land $L_{S1-}$ and the signal terminal land $L_{S1+}$).

The spacing P between the front lands Lf is wider than the spacing Q between the rear lands Lr.

6: Connection Structure of Terminal and Land.

Figure 8:
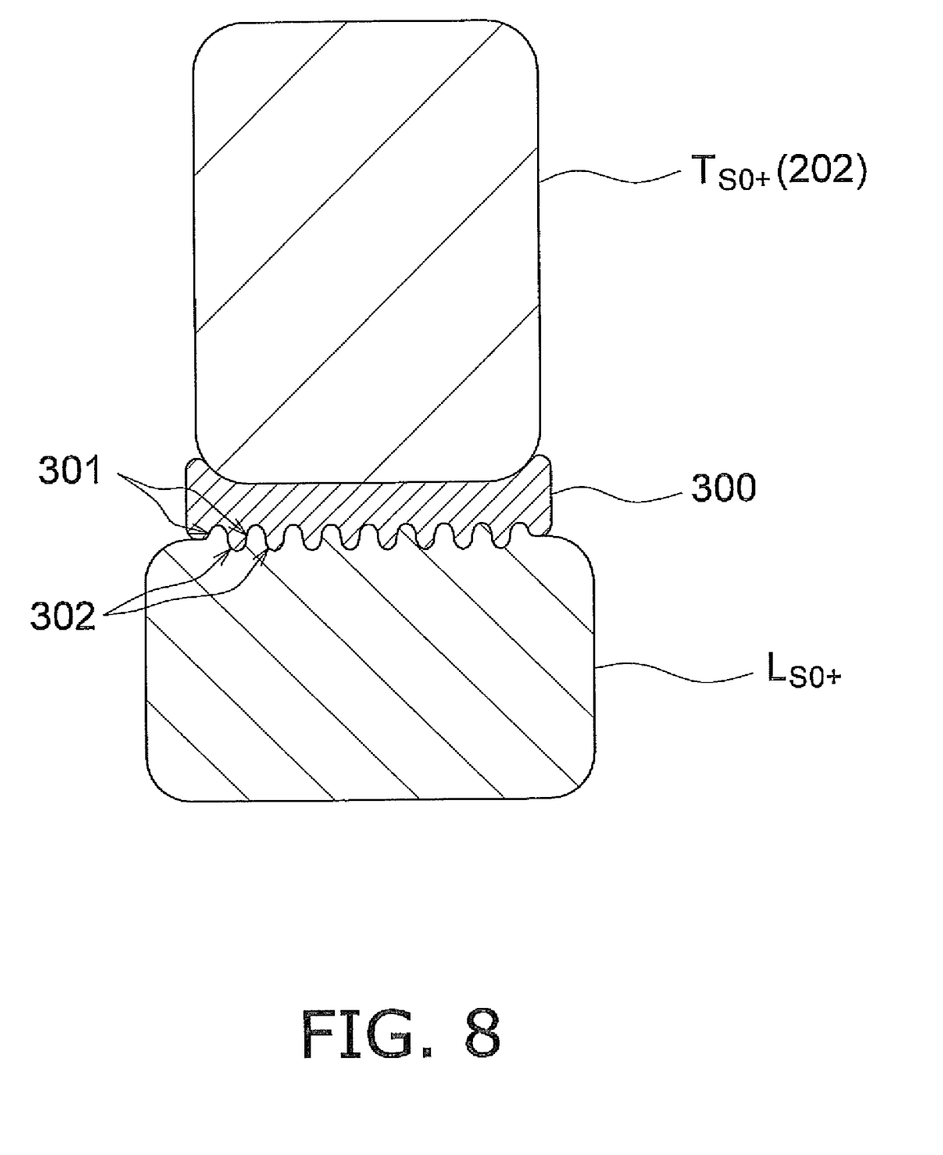
FIG. 8 is a cross section along the A-A line in FIG. 6.

FIG. 8 is a cross section along the A-A line in FIG. 6. As shown in FIG. 8, the front connection part 202 of the signal terminal $T_{S0+}$ is connected to the signal terminal land $L_{S0+}$ via a conductive joining layer 300. The conductive joining layer 300 is constituted by solder or another such conductive joining material.

The signal terminal land $L_{S0+}$ has a plurality of convex portions 301 and a plurality of concave portions 302 formed on the surface. The convex portions 301 bite into the conductive joining layer 300. The conductive joining layer 300 sinks into the concave portions 302.

Although not shown in the drawings, the convex portions 301 and the concave portions 302 may be formed in that region of the surface of the signal terminal land $L_{S0+}$ that is in contact with the conductive joining layer 300.

7: Operation and Effect (1) The receptacle 12 pertaining to this embodiment includes the signal terminal $T_{S1+}$ (first terminal) having the rear connection part 102 (first rear connection part) connected to the printed wiring board 11, and the ground terminal $T_{G1}$ (second terminal) having the front connection part 202 (first front connection part) connected to the printed wiring board 11 farther away from the opening 12B than the rear connection part 102. The width $\gamma_2$ of the front connection part 202 is narrower than the width $\delta_2$ of the rear connection part 102.

Since the front connection part 202 of the ground terminal $T_{G1}$ is thus narrower in width, the width X of the ground terminal land $L_{G1}$ connected to the ground terminal $T_{G1}$ can be narrower. Accordingly, the rear wire $Wr_{S1+}$ can be provided on the side of the ground terminal land $L_{G1}$ with plenty of room. Therefore, there is no need to use a substrate body that allows a very fine wiring pattern to be formed very precisely. As a result, the production costs of the printed wiring board 11 can be kept down.

(2) The receptacle 12 pertaining to this embodiment further includes the signal terminal $T_{S2-}$ (third terminal) having a front connection part 202 (second front connection part) that is connected to the printed wiring board 11. The front connection part 202 of the signal terminal $T_{S2-}$ is laterally adjacent to the front connection part 202 of the ground terminal $T_{G1}$. The width $\gamma_2$ of the front connection part 202 of the signal terminal $T_{S2-}$ is narrower than the width $\delta_2$ of the rear connection part 102.

Since the front connection part 202 of the signal terminal $T_{S2-}$ is thus narrower in width, the width X of the signal terminal land $L_{S2-}$ connected to the signal terminal $T_{S2-}$ can be narrower. Accordingly, the rear wire $Wr_{S1+}$ can be lined between the ground terminal land $L_{G1}$ and the signal terminal land $L_{S2-}$ with plenty of room.

(3) The receptacle 12 pertaining to this embodiment includes the signal terminal $T_{S1-}$ (fourth terminal) and the signal terminal $T_{S0+}$ (fifth terminal). The signal terminal $T_{S1-}$ has the rear connection part 102 (second rear connection part) that is connected to the printed wiring board 11. The signal terminal $T_{S0+}$ has the front connection part 202 (third front connection part) that is provided on the opposite side from the front connection part 202 (second front connection part) of the signal terminal $T_{S2-}$, with the front connection part 202 (first front connection part) of the ground terminal $T_{G1}$ in between. The width $\gamma_2$ of the front connection part 202 of the signal terminal $T_{S0+}$ is narrower than the width $\delta_2$ of the rear connection part 102 of the signal terminal $T_{S1-}$.

Since the front connection part 202 of the signal terminal $T_{S0+}$ is thus narrower in width, the width X of the signal terminal land $L_{S+}$ connected to the signal terminal $T_{S1+}$ can be narrower. Accordingly, the rear wire $Wr_{S1-}$ can be lined between the ground terminal land $L_{G1}$ and the signal terminal land $L_{S0+}$ with plenty of room.

(4) With the receptacle 12 pertaining to this embodiment, the signal terminal $T_{S1+}$ has the rear connection part 102, and the ground terminal $T_{G1}$ has the front connection part 202.

Therefore, the rear wire $Wr_{S1+}$ can be provided on the side of the ground terminal land $L_{G1}$, so the wiring pattern that transmits digital signals can be shorter. As a result, there is less decrease in the quality of the digital signals transmitted.

(5) The ground terminal $T_{G1}$ (second terminal) is made up of the flat metal member in the form of twisted plates. Accordingly, the front connection part 202 can be easily formed without subjecting the metal member to any cutting or other such machining. As a result, the production cost of the receptacle 12 can be kept down.

(6) The printed wiring board 11 pertaining to this embodiment includes the signal terminal land $L_{S1+}$ (first land) and the ground terminal land $L_{G1}$ (second land) which is provided farther away from the edge portion $11_{EDG}$ of the substrate body 11A than the signal terminal land $L_{S1+}$. The width X of the ground terminal land $L_{G1}$ is narrower than the width Y of the signal terminal land $L_{S1+}$.

Accordingly, the rear wire $Wr_{S1+}$ can be provided on the side of the ground terminal land $L_{G1}$ with plenty of room. Therefore, there is no need to use the substrate body that allows a very fine wiring pattern to be formed very precisely. As a result, the production cost of the printed wiring board 11 can be kept down.

(7) The printed wiring board 11 pertaining to this embodiment includes the signal terminal land $L_{S2-}$ (third land) that is laterally adjacent to the ground terminal land $L_{G1}$. The width X of the signal terminal land $L_{S2-}$ is narrower than the width Y of the signal terminal land $L_{S1+}$.

Accordingly, the rear wire $Wr_{S1+}$ can be lined between the ground terminal land $L_{G1}$ and the signal terminal land $L_{S2-}$ with plenty of room.

(8) The printed wiring board 11 pertaining to this embodiment includes the signal terminal land $L_{S1-}$ (fourth land) that is laterally adjacent to the signal terminal land $L_{S1+}$, and the signal terminal land $L_{S0+}$ (fifth land) that is provided on the opposite side from the signal terminal land $L_{S2-}$, with the ground terminal land $L_{G1}$ in between. The width X of the signal terminal land $L_{S0+}$ is narrower than the width Y of the signal terminal land $L_{S1-}$.

Accordingly, the rear wire $Wr_{S1-}$ can be lined between the ground terminal land $L_{G1}$ and the signal terminal land $L_{S0+}$ with plenty of room.

(9) The ground terminal land $L_{G1}$ pertaining to this embodiment has the convex portions 301 and the concave portions 302 on the surface.

Therefore, the convex portions 301 can bite into the conductive joining layer 300. Also, the conductive joining layer 300 can sink into the concave portions 302. Accordingly, anchor effect improves the connection strength between the ground terminal land $L_{G1}$ and the ground terminal $T_{G1}$. As a result, even though the width X of the ground terminal land $L_{G1}$ is narrowed, there will be little decrease in the connection strength between the ground terminal land $L_{G1}$ and the ground terminal $T_{G1}$.

Other Embodiments

Embodiment of the present invention is given above, but the text and description that form part of this disclosure should not be interpreted as limiting the present invention. Various alternative embodiments, working examples, and technical applications should be clear to a person skilled in the art from this disclosure.

(1) In the above embodiment, each of the top terminals $T_{TOP}$ has the front connection part 202, and each of the bottom terminals $T_{BTM}$ has the rear connection part 102, but this is not the only option. For example, only some of the top terminals $T_{TOP}$ may have the front connection part 202. Furthermore, all of the top terminals $T_{TOP}$ may have the rear connection part 102, and all of the bottom terminals $T_{BTM}$ may have the front connection part 202.

Thus, although the structure of the terminal group 12D is described in the above embodiment through reference to the drawings, the structure of the terminal group 12D is not limited to what is illustrated in the drawings. The structure of the terminal group 12D can be subjected to various design modifications.

(2) In the above embodiment, all of the front connection parts 202 were formed narrower, but this is not the only option. For example, only one of the front connection parts 202 may be formed narrower.

(3) In the above embodiment, the narrow portion 203T is formed by twisting process, but this is not the only option. For example, the narrow portion 203T may be formed by cutting process or the like. At the boundary between the wide portion 203S and the narrow portion 203T, the width preferably narrows gradually from the wide portion 203S toward the narrow portion 203T. Also, at the boundary between the wide portion 203S and the narrow portion 203T, the thickness preferably increases gradually from the wide portion 203S toward the narrow portion 203T.

(4) In the above embodiment, the terminal insulating board 12C did not overlap the rear connection parts 102 or the front connection parts 202 in plan view, but this is not the only option. The terminal insulating board 12C may overlap the rear connection parts 102 and/or the front connection parts 202 in plan view.

(5) In the above embodiment, the interface 10 that conforms to the HDMI standard was described as an example of an interface between electronic devices, but this is not the only option. For example, a serial interface that conforms to USB (Universal Serial Bus), DVI (Digital Visual Interface®), IEEE (Institute of Electrical and Electronic Engineers) 1394, or another such standard can be used as an interface between electronic devices.

(6) In the above embodiment, it was stated that signals were transmitted by a pseudo-differential signaling method such as TMDS method and the like, but this is not the only option. For example, signals may be transmitted by a differential signaling method based on the USB standard.

(7) Although not specifically mentioned in the above embodiment, the width of the signal terminal $T_S$, the width of the ground terminal $T_G$, and the spacing between the signal terminal $T_S$ and the ground terminal $T_G$ can be suitably set. This allows the characteristic impedance of the path to be adjusted.

Thus, it should go without saying that the present invention encompasses various embodiment(s) and so forth not discussed herein. Therefore, the technical scope of the present invention is determined only by the matters specifying the claimed invention pertaining to the appropriate claims derived from the above description.

General Interpretation of Terms

In understanding the scope of the present disclosure, the term "comprising" and its derivatives, as used herein, are intended to be open ended terms that specify the presence of the stated elements, groups, and the like, but do not exclude the presence of other unstated elements, groups, and the like. The foregoing also applies to words having similar meanings such as the terms, "including", "having" and their derivatives. Also, the terms "part," "portion," "member" or "element" when used in the singular can have the dual meaning of a single part or a plurality of parts. Also as used herein to describe the above embodiment(s), the following directional terms "forward", "rear", "vertical", "perpendicular" and "extending" as well as any other similar directional terms refer to those directions of the receptacle, the printed wiring board and/or the electronic device. Accordingly, these terms, as utilized to describe the present invention should be interpreted relative to a receptacle.

The term "configured" as used herein to describe a component, section, or part of a device implies the existence of other unclaimed or unmentioned components, sections, members or parts of the device to carry out a desired function.

The terms of degree such as "substantially" as used herein mean a reasonable amount of deviation of the modified term such that the end result is not significantly changed.

What is claimed is:

1. A receptacle structure comprising:
   a housing configured to be mounted on a printed wiring board, the housing defining an interior space with an opening and configured to accommodate a plug;
   a terminal insulating board including a top face and a bottom face opposite the top face, the terminal insulating board being disposed inside the housing with the bottom face facing the printed wiring board;
   a first terminal including a first rear connection part, the first terminal being connected to the printed wiring board via the first rear connection part and to the terminal insulating board; and
   a second terminal including a first front connection part having a width narrower than the first rear connection part when viewed from the top face side, the second terminal being connected to the printed wiring board via the first front connection part and to the terminal insulating board, the first front connection part being connected to the printed wiring board farther away from the opening than the first rear connection part.

2. The receptacle structure according to claim 1, further comprising
   a third terminal including a second front connection part laterally adjacent to the first front connection part and having a width narrower than the first rear connection part when viewed from the top face side, the third terminal being connected to the printed wiring board via second front connection part and to the terminal insulating board.

3. The receptacle structure according to claim 2, further comprising
   a fourth terminal including a second rear connection part laterally adjacent to the first rear connection part, the fourth terminal being connected to the printed wiring board via the second rear connection part and to the terminal insulating board which is; and
   a fifth terminal including a third front connection part having a width narrower than the second rear connection part when viewed from the top face side, the fifth terminal being connected to the printed wiring board via the third front connection part and to the terminal insulating board.

4. The receptacle structure according to claim 3, wherein the first front connection part is disposed between the second front connection part and the third front connection part.

5. The receptacle structure according to claim 1, wherein the first terminal is a signal terminal and the second terminal is a ground terminal.

6. The receptacle structure according to claim 1, wherein the second terminal is a twisted metal plate.

7. A printed wiring board structure comprising:
a substrate body having a mounting face configured to support a receptacle having a signal terminal and a ground terminal;
a first land provided on the mounting face;
a second land provided on the mounting face and disposed farther away from an edge portion of the substrate body than the first land, the second land being narrower than the first land; and
a plurality of rear wires provided on the mounting face away from the edge portion of the substrate body, the second land being laterally disposed between a pair of the plurality of rear wires.

8. The printed wiring board according to claim 7, further comprising
a third land provided on the mounting face laterally adjacent to the second land, the third land is narrower than the first land.

9. The printed wiring board according to claim 8, further comprising
a fourth land provided on the mounting face laterally adjacent to the first land; and
a fifth land provided on the mounting face and is narrower than the first land.

10. The printed wiring board according to claim 9, wherein the pair of the plurality of rear wires are disposed between the third land and the fifth land, and the second land is disposed between the pair of the plurality of rear wires and between the third land and the fifth land.

11. The printed wiring board according to claim 7, wherein the second land includes a mating surface formed with convex and concave portions.

12. The printed wiring board according to claim 7, wherein the first land is connected to the signal terminal of the receptacle and the second land is connected to the ground terminal of the receptacle.

13. An electronic device comprising:
a printed wiring board and a receptacle mounted on the printed wiring board, the receptacle including
a housing defining an interior space with an opening and configured to accommodate a plug,
a terminal insulating board including a top face and a bottom face opposed to the top face, the terminal insulating board being disposed inside the housing with the bottom face facing the printed wiring board,
a first terminal including a first rear connection part, the first terminal being connected to the printed wiring board via the first rear connection part and to the terminal insulating board, and
a second terminal including a first front connection part having a width narrower than the first rear connection part, the second terminal being connected to the printed wiring board via the first front connection part and to the terminal insulating board, the first front connection part being connected to the printed wiring board farther away from the opening than the first rear connection part, and
the printed wiring board including
a substrate body having a mounting face supporting the receptacle,
a first land provided on the mounting face, and
a second land provided on the mounting face and disposed farther away from an edge portion of the substrate body than the first land, the second land being narrower than the first land when viewed from the top face side.

14. The printed wiring board according to claim 9, wherein one of the rear wires of the pair of the plurality of rear wires is connected to the first land while the other rear wire of the pair is connected to the fourth land.

* * * * *